12) United States Patent
Soong et al.

(10) Patent No.: US 10,367,125 B2
(45) Date of Patent: Jul. 30, 2019

(54) STRENGTHENED LED PACKAGE AND METHOD THEREFOR

(71) Applicant: Lumileds LLC, San Jose, CA (US)

(72) Inventors: Chee Weng Soong, Eindhoven (NL); Tomonari Ishikawa, Eindhoven (NL); Su Ping Tan, Eindhoven (NL); Chiou Bee Goh, Eindhoven (NL)

(73) Assignee: Lumileds, LLC, San Jose, CA (US)

( * ) Notice: Subject to any disclaimer, the term of this patent is extended or adjusted under 35 U.S.C. 154(b) by 0 days.

(21) Appl. No.: 14/418,094

(22) PCT Filed: Jul. 12, 2013

(86) PCT No.: PCT/IB2013/055761
§ 371 (c)(1),
(2) Date: Jan. 29, 2015

(87) PCT Pub. No.: WO2014/020470
PCT Pub. Date: Feb. 6, 2014

(65) Prior Publication Data
US 2015/0162512 A1 Jun. 11, 2015

Related U.S. Application Data

(60) Provisional application No. 61/677,107, filed on Jul. 30, 2012.

(51) Int. Cl.
H01L 33/62 (2010.01)
H01L 23/495 (2006.01)

(52) U.S. Cl.
CPC .......... H01L 33/62 (2013.01); H01L 23/495 (2013.01); H01L 23/49541 (2013.01); H01L 23/49548 (2013.01); H01L 23/49551 (2013.01); H01L 23/49555 (2013.01); H01L 23/49575 (2013.01); H01L 23/49544 (2013.01); H01L 2924/0002 (2013.01); H01L 2933/0066 (2013.01)

(58) Field of Classification Search
CPC .............. H01L 33/62; H01L 23/49544; H01L 2933/0066; H01L 2924/0002; H01L 2924/00; H01L 23/49548; H01L 23/49565
See application file for complete search history.

(56) References Cited

U.S. PATENT DOCUMENTS 4,283,839 A   8/1981 Gursky
5,403,785 A * 4/1995 Arai ................. H01L 23/49506
                                                            228/111

(Continued)

FOREIGN PATENT DOCUMENTS

GB    2132015 A    6/1984

OTHER PUBLICATIONS

Snapled 70 Technical Data DS09 (Aug. 2005).

(Continued)

Primary Examiner — Ermias T Woldegeorgis
(74) Attorney, Agent, or Firm — Volpe and Koenig, P.C.

(57) ABSTRACT

Crimping of an LED leadframe to a subassembly may stress the leadframe. Flat leadframes cannot accommodate these stresses. Strain relief sections are added to the leadframe to accommodate crimping or other stresses on the leadframe. Strain relief sections are created in the leadframe in the form of openings, notches or bulges. The strain relief sections may be symmetric or asymmetric.

6 Claims, 5 Drawing Sheets

(56) References Cited

U.S. PATENT DOCUMENTS

| | | | |
|---|---|---|---|
| 5,404,282 A | | 4/1995 | Klinke et al. |
| 5,519,596 A | | 5/1996 | Woolverton |
| 5,545,921 A | * | 8/1996 | Conru ................. H01L 23/4951 257/669 |
| 5,777,380 A | * | 7/1998 | Otsuki .................. H01L 21/565 257/674 |
| 6,325,682 B1 | | 12/2001 | Seidler |
| 6,335,548 B1 | * | 1/2002 | Roberts ............. H01L 23/49562 250/239 |
| 6,348,727 B1 | * | 2/2002 | Westmarland .... H01L 23/49562 257/675 |
| 6,936,855 B1 | * | 8/2005 | Harrah ...................... F21K 9/00 257/59 |
| 2002/0089064 A1 | * | 7/2002 | Wu ................... H01L 23/49544 257/773 |
| 2002/0149090 A1 | | 10/2002 | Ikenaga et al. |
| 2004/0061204 A1 | * | 4/2004 | Han ................. H01L 23/49503 257/666 |

OTHER PUBLICATIONS

TW Office Action, Application 102127284, dated Dec. 6, 2016, 12 pgs.
CN Second Office Action dated Jun. 2, 2017, China Patent Application No. 2013/0040716.8, 15 pages.

\* cited by examiner

STRENGTHENED LED PACKAGE AND METHOD THEREFOR

CROSS-REFERENCE TO PRIOR APPLICATIONS

This application is the U.S. National Phase application under 35 U.S.C. § 371 of International Application No. PCT/IB2013/055761, filed on Jul. 12, 2013, which claims the benefit of U.S. Patent Application No. 61/677,107, filed on Jul. 30, 2012. These applications are hereby incorporated by reference herein.

FIELD OF THE INVENTION

The present disclosure relates to a process which strengthens light emitting diode (LED) packages.

BACKGROUND

Typically an LED is mounted to a leadframe. The leadframe may be attached to a luminaire or a module. Typically the leadframe provides electrical connectivity to the LED. The leadframe may also provide mechanical support for the LED or may be used to arrange several LEDs in an array. In the alternative, different leadframes are arranged on a circuit board to create an array of LEDs.

Typical leadframes increase the overall height of the packaged LED. Flat leadframes reduce the height of the mounted LED which is desirable for many applications such as automotive assemblies, e.g., taillights. It is also desirable to use a low cost method, such as clinching, to fasten the individual LEDs to an assembly. Clinching is a mechanical process that electrically and mechanically connects thin metal surfaces to each other as is known in the art. A more complete description of clinching may be found in U.S. Pat. Nos. 5,404,282 and 5,519,596 which are incorporated by reference. However, clinching may stress a flat leadframe. A stressed leadframe may lead to an unreliable assembly. Therefore, it would be desirable to create an LED package enable reliable clinching of a flat leadframe.

SUMMARY

An LED may be attached to a flat leadframe. The flat leadframe may be attached to the LED via pads placed on the sides or the bottom of the LED. The leadframe may contain one or more strain relief regions. Strain relief regions may be take the form of cutouts, indentations or crimped regions.

DETAILED DESCRIPTION

Figure 1A:
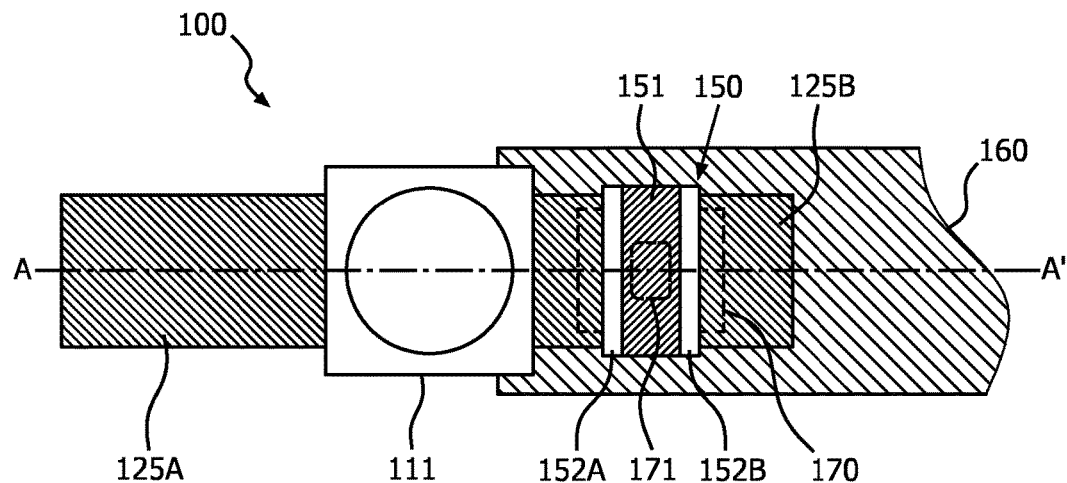
FIG. 1a is a top view of a bent leadframe prior to clinching to a subassembly plate.

Although any type of semiconductor or electronic device can utilize the invention, the remainder of the description will use a packaged LED with a lens in order to simplify the description. Although the remainder of the description only refers to LEDs, any device may use the invention including lasers, solar cells, detectors, DRAM, SRAM, ROM, Flash memory, MEMS devices, microprocessors, logic gates, FPGAs or any other suitable device. Likewise, although a square die shape is described, any suitable die shape or shapes are contemplated and are included within the scope of the invention.

Although two members, or leads, comprise the leadframe in all of the examples, a single lead or more that two leads are contemplated and are included within the scope of the invention. Although the leads shown are on opposite side of the device, other configuration such as leads at right angles to each other, or two leads on the same side of the package, or any other suitable combination are contemplated and are included within the scope of the invention.

Although the leads are shown as rectangular, with one dimension longer than the other, other shapes such as squares, triangle or arbitrary shapes are contemplated and included within the scope of the invention. Typical shapes of the leads may depend on the mechanical requirements of the module or subassembly utilizing the LED.

Although a rectangular even cross section is shown for the leads, other cross sections including rounded cross section, rounding in or more dimensions, rounded corners or any suitable cross section are contemplated and included within the scope of the invention.

Although a packaged LED is shown, bare LED dice, LEDs with or without a submount, with or without a lens or any combination are contemplated and are included within the scope of the invention. Although a flat leadframe is shown attached to the sides of the LED package other configuration such as mounting the flat leadframe to the bottom of the LED package or using a bent leadframe are contemplated and are included within the scope of the invention.

In the following discussion the LED will be a mounted packaged rectangular LED with a lens. The LED will be in the shape of a rectilinear parallelepiped. The light emitting side with the lens will be the "top" of the LED. The "bottom" of the LED will be the side of the parallelepiped opposite the lens. The "sides" of the LED will be at right angles to both the top and the bottom of the LED.

Semiconductor light emitting devices, such as light emitting diodes (LEDs), are among the most efficient light sources currently available. LEDs are typically mounted on a submount. Mounted LED may be further "packaged" with a lens. The submount may be connected to a leadframe. Typically the leadframe connects to the bottom of the LED opposite the lens. However a flat leadframe may be connected to the sides of the mounted LED. The entire LED may be enclosed in epoxy or any other suitable material. In particular a hard temperature resistant material may be used for automotive applications.

Typical lead frames are bent which accommodates mechanical stresses that may occur when the LED is connected a subassembly or circuit board. Connecting the leadframe to the bottom of the LED or to the sides of the LED reduces the overall height of the LED, where height is the distance between the lens of the LED and the subassembly on which the LED is mounted. A flat leadframe does not have a bent area to accommodate the stress of mounting. In order to accommodate the stress of mounting an LED connected to a flat leadframe, the flat leadframe may incorporate strain relief regions.

FIG. 1a shows a top view of an exemplary LED 100 with a bent leadframe. LED 100 includes a packaged LED 111 connected to leads 125A and 125B. In this example leads 125A and 125B are the entire bent leadframe. In the alternative the bent leadframe may be more complex and include mechanical features, multiple connection points, circuitry or any other suitable construction.

Lead 125B of LED 100 is positioned over a portion of a subassembly plate 160 prior to clinching. Subassembly plate 160 may be a copper alloy substrate. Typically subassembly plate 160 would be clinched to leads 125A and 125B simultaneously. However, only a portion of subassembly plate 160 is shown connecting to a single lead 125B in so that the clinching process may be clearly illustrated. Subassembly plate 160 may be complex and accommodate one or more than one LEDs 100. Subassembly plate 160 may also include mechanical protrusions to accommodate placement in a device, e.g., a car taillight module. Subassembly plate 160 may accommodate circuit boards or any suitable device.

In an exemplary method of clinching, an anvil 150 is positioned over lead 125B and a punch 170 (dashed lines) is positioned below subassembly plate 160. Anvil 150 may be constructed of an inner anvil 151 and two outer plates 152A and 152B. A narrow portion 171 of punch 170 may be position under inner anvil 151. Although anvil 150 and punch 170 are shown as smaller than lead 125B either anvil 150 or punch 170 may be larger than lead 125B. Typically anvil 150 and punch 170 would clinch leads 125A and 125B simultaneously or many LEDs 100 at the same time. However, all of the figures show the clinching apparatus for a single leads 125B for illustrative purposes.

Figure 1B:
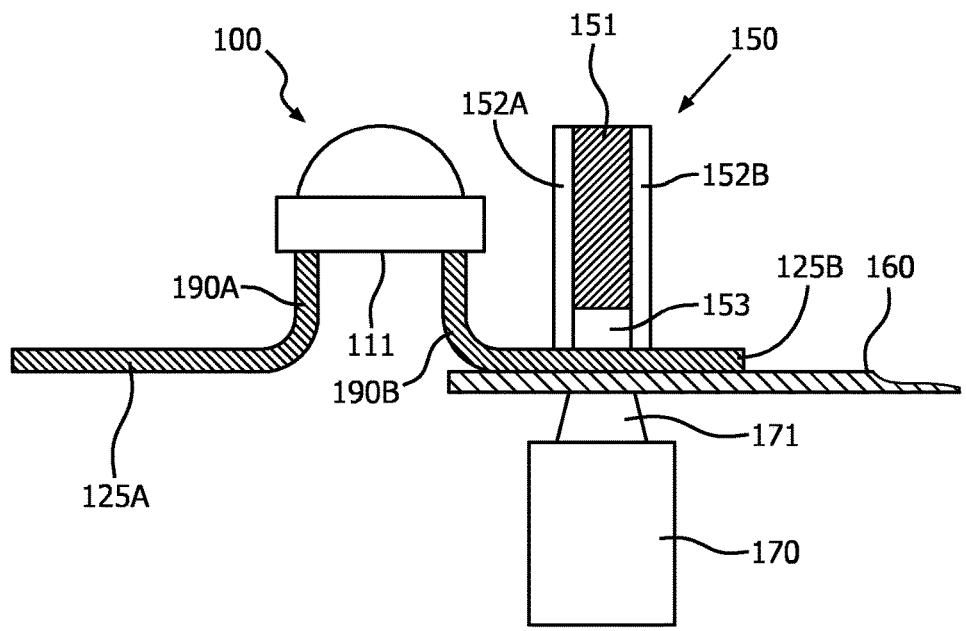
FIG. 1b is a side view of a bent leadframe prior to clinching to a subassembly plate.

FIG. 1b shows a side view of LED 100 along axis A-A' in FIG. 1a, prior to clinching. Lead 125A has a bent portion 190A. Lead 125B has a bent portion 190B. Outer plates 152A and 152B of anvil 150 may extend beyond inner anvil 151 leaving a void 153 beneath a portion of anvil 150 over narrow portion 171 of punch 170.

Figure 1C:
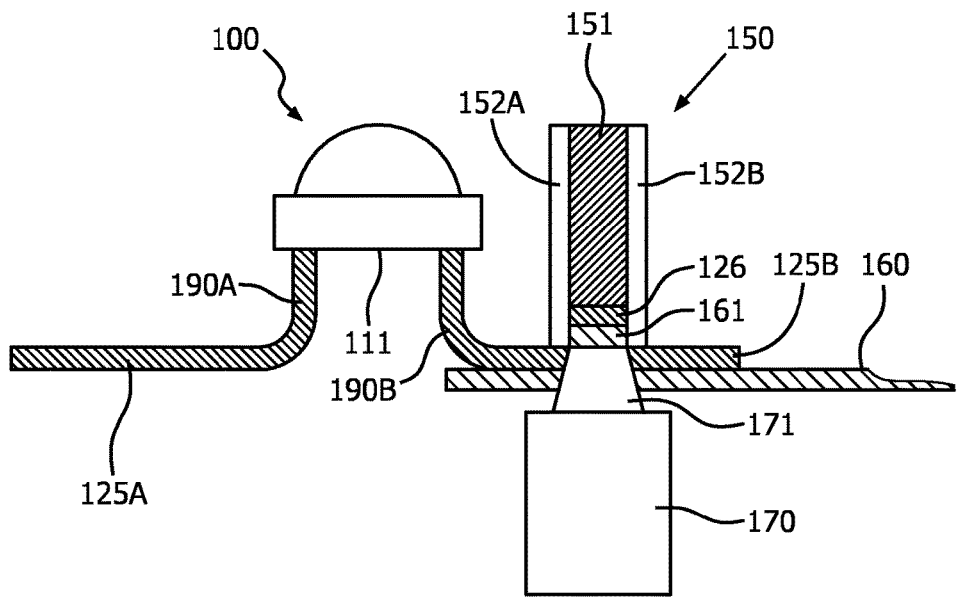
FIG. 1c is a side view of a bent leadframe in the process of clinching to a subassembly plate.

FIG. 1c shows a side view of LED 100 along axis A-A' in FIG. 1a, during the clinching process. Narrow portion 171 of punch 170 now protrudes through both subassembly plate 160 and lead 125B. A portion 126 of lead 125B and a portion 161 of subassembly plate 160 have been forced by the punch 170 into the void 153 (now occupied or partially occupied) between inner anvil 151 and outer plates 152A and 152B of anvil 150. Portion 126 may be connected, at least partially, to lead 125B and portion 161 may be connected, at least partially, to subassembly plate 160. Typically, portion 126 and portion 161 form a "dimple" of metal. One or all of the sides of the dimple may remain connected during the entire clinching process.

Figure 1D:
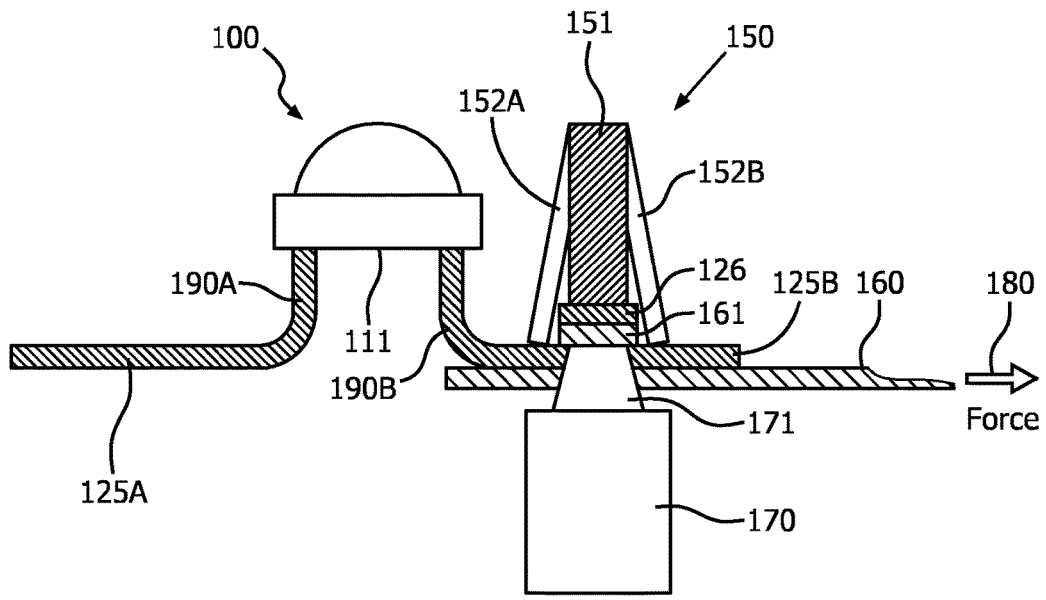
FIG. 1d is a side view of a bent leadframe at the conclusion of clinching to a subassembly plate.

FIG. 1d shows a side view of LED 100 along axis A-A' in FIG. 1a, at the completion of the clinching process. Narrow portion 171 of punch 170 now forces the dimple of portion 126 and portion 161 to be larger than the opening in lead 125B. This expansion of the dimple is permitted when side plates 125A and 125B are displaced away from inner anvil 151. The expanded dimple may connect lead 125b to subassembly plate 160 mechanically and/or electrically.

The clinching process pulls lead 125B away from packaged LED 111 along the force direction 180. Typically both lead 125A and 125B are clinched simultaneously, thus force is applied in opposite direction pulling the leads 125A and 125B away from packaged LED 111. Typically, bent portions 190A, 190B accommodate the pulling force. In the alternative compression forces on the leads 125A and 125B toward packaged LED 111 may be applied by the clinching process.

Although the long axis of the anvil is shown in the drawings as perpendicular to axis A-A' in FIG. 1a which is the long axis of lead 125B, other orientations are contemplated and are included within the scope of the invention, e.g. the long axis of the anvil may be at right angles to axis A-A' in FIG. 1a or at any other angle to axis A-A' in FIG. 1a.

Figure 2A:
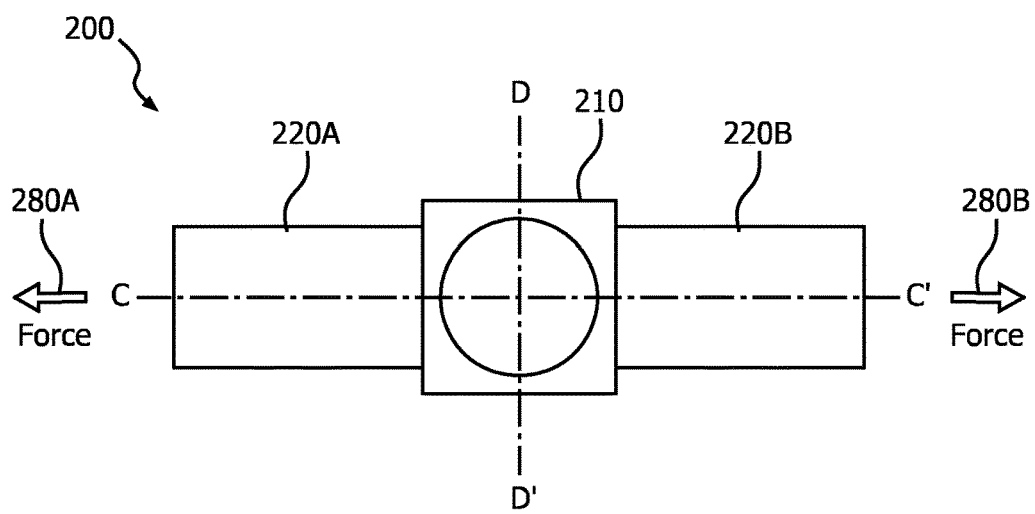
FIG. 2a is a top view of an LED attached to a flat leadframe with axis A-A' and axis B-B'.

FIG. 2a is a top view of an exemplary LED 200 with a flat leadframe. LED 200 may include packaged LED 210 connected to leads 220A and 220B. In this example leads 220A and 220B are the entire flat leadframe. In the alternative the flat leadframe may be more complex as described above. Leads 220A and 220B may be connected to the sides of packaged LED 210 or to the bottom of LED 210 opposite the lens.

Forces 280A and 280B may be the result of a clinching leads 220A and 220B to a subassembly plate (not shown). Because leads 220A and 220B do not have a bend, leads 220A and 220B or their connection to packaged LED 210 may be placed under excessive stress. A portion of the stress may be along the long axis C-C' of the leads 220A and 220B. Excessive stress may lead to fracturing of leads 220A and 220B or their connection to packaged LED 210. The flat leadframe and the packaged LED 210 may be covered in a molded epoxy or any other suitable material. In particular a hard temperature resistant material may be used for automotive applications.

Figure 2B:
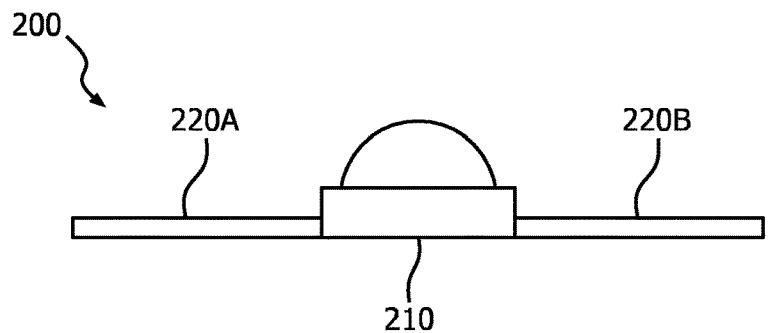
FIG. 2b is a side view of an LED attached to a flat leadframe along axis A-A'.

FIG. 2b shows a side view of LED 200 along axis C-C' in FIG. 2a. LED 200 includes leads 220A and 220B attached to the sides of the packaged LED 210.

Figure 2C:
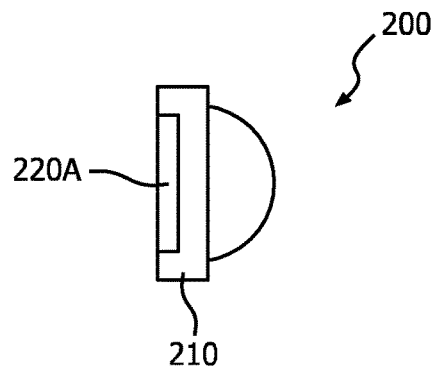
FIG. 2c is a side view of an LED attached to a flat leadframe along axis B-B' portion of a wafer of LEDs.

FIG. 2c shows a side view of LED 200 along axis D-D' in FIG. 2a. Only Lead 220A is visible in this view.

Figure 2D:
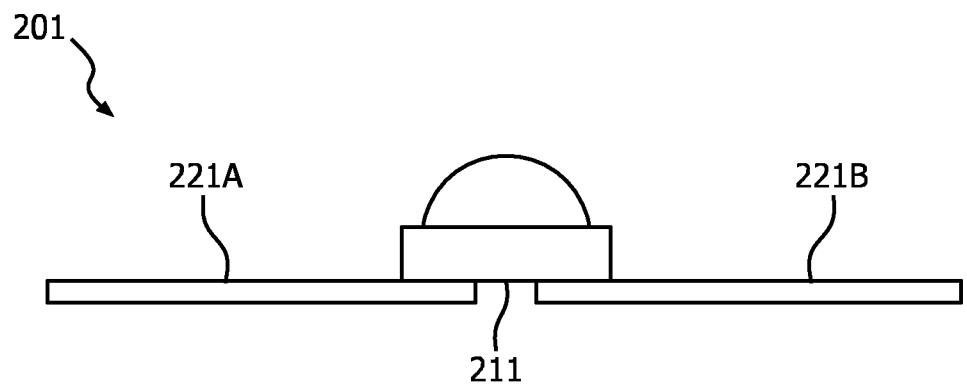
FIG. 2d is a top view of an LED attached to an alternate flat leadframe.

FIG. 2d shows a side view of an LED 201 along axis. LED 201 includes leads 220A and 220B attached to the bottom of packaged LED 211.

Figure 3:
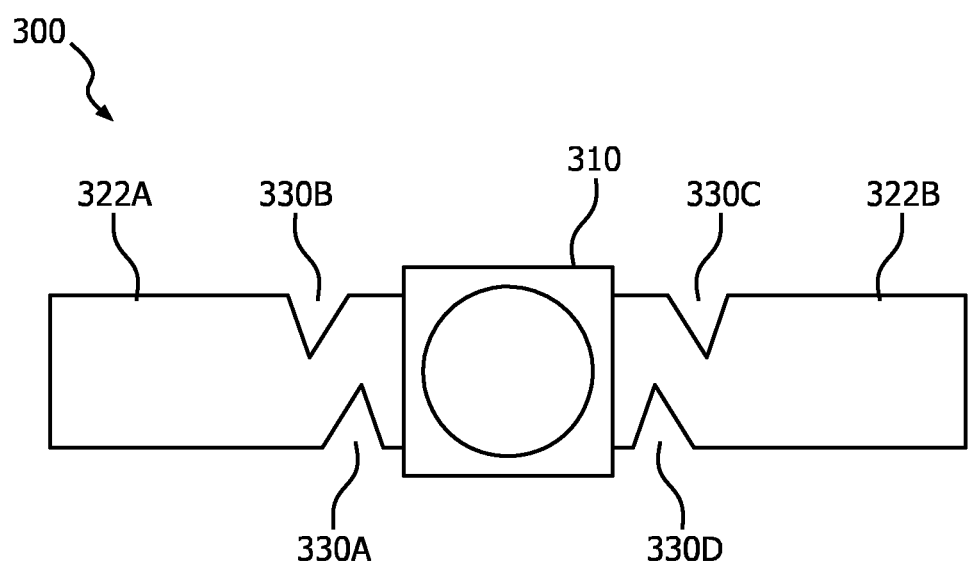
FIG. 3 shows a top view of a flat leadframe with strain relief cutouts.

FIG. 3 is a top view of one embodiment of an LED 300 with a flat leadframe and strain relief sections. LED 300 includes packaged LED 310 connected to leads 322A and 322B. In this example leads 322A and 322B are the entire flat leadframe. In the alternative the flat leadframe may be more complex as described above. Leads 322A and 322B may be connected to the sides of packaged LED 310 or to the bottom of LED 310 opposite the lens.

Strain relief openings 330A and 330B may be created in lead 322A. Strain relief openings 330C and 330D may be created in lead 322B. If forces pull or push along the long axis of leads 322A and 322B, strain relief openings 330A-330D may accommodate the stress preventing or reducing damage to leads 322A, 322B and/or the connection of leads 322A, 322B to packaged LED 310.

Although leads 322A, 322B are shown as rectangular, other shapes are possible as described above. Although openings 330A-330D are shown as triangular openings other shapes such as rectangles or any other suitable shape are contemplated and are included within the scope of the invention. In particular rounded shapes, such as triangles with one or more rounded points are included within the scope of the invention. Openings 330A-330D may be formed by punching, etching, forging or any other suitable method.

Figure 4:
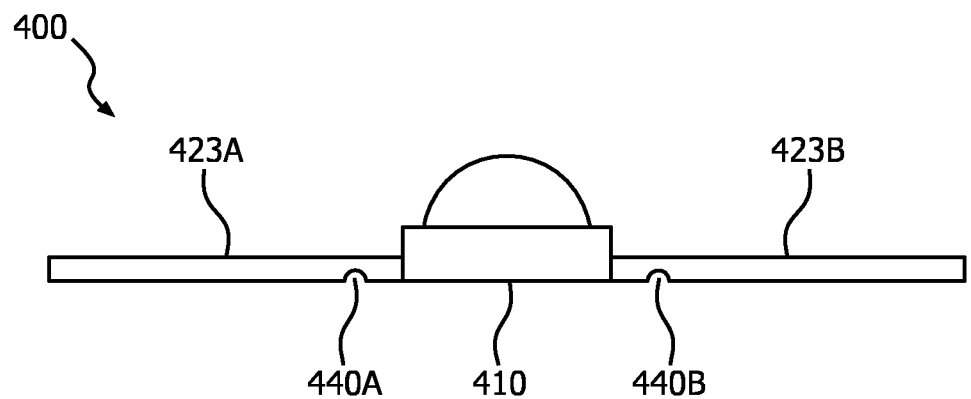
FIG. 4 shows a side view of a flat leadframe with etched notches on the underside of the leadframe.

FIG. 4 is a side view another embodiment of an LED 400 with a flat leadframe and strain relief sections. LED 400 includes packaged LED 410 connected to leads 423A and 423B. In this example, 423A and 423B are the entire flat leadframe. In the alternative the flat leadframe may be more complex as described above. Leads 423A and 423B may be connected to the sides of packaged LED 410 or to the bottom of LED 410 opposite the lens.

Strain relief notches 440A and 440B may be created in leads 423A and 423B. If forces pull or push along the long axis of leads 440A and 440B, notches 440A and 44B may accommodate the stress preventing or reducing damage to leads 423A, 423B and/or the connection of leads 423A, 423B to packaged LED 410.

Although leads 440A and 440B are shown as rectangular, other shapes are possible as described above. Although notches 440A and 440B are shown as semicircular, other cross sections, such as triangular or any suitable shape, are contemplated and are included within the scope of the invention. Although the notches appear to penetrate half-way (50%) through the lead thickness, other penetrations, such as 25% or 90% or any suitable penetration, are contemplated and included within the scope of the invention. Notches may be formed by machining, etching, stamping or any suitable method.

Figure 5:
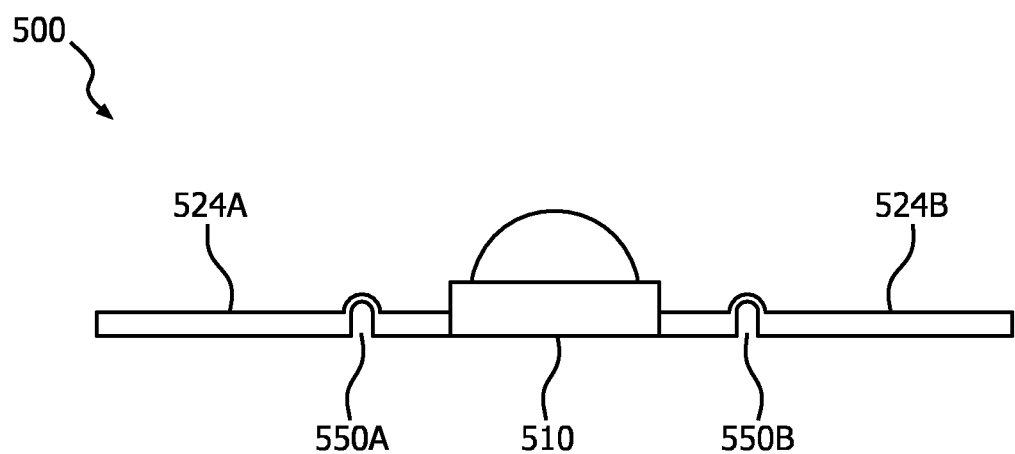
FIG. 5 shows a side view of a flat leadframe with crimped strain relief regions; and Use of the same reference numbers in different figures indicates similar or identical elements.

FIG. 5 is a side view another embodiment of an LED 500 with a flat leadframe and strain relief sections. LED 500 includes packaged LED 510 connected to leads 524A and 524B. In this example, 524A and 524B are the entire flat leadframe. In the alternative the flat leadframe may be more complex as described above. Leads 524A and 524B may be connected to the sides of packaged LED 510 or to the bottom of LED 510 opposite the lens.

Strain relief bulges 550A and 550B may be created in leads 524A and 524B. If forces pull or push along the long axis of leads 524A and 524B, bulges 550A and 550B may accommodate the stress preventing or reducing damage to leads 523A, 523B and/or the connection of leads 523A, 523B to packaged LED 510.

Although leads 524A and 524B are shown as rectangular, other shapes are possible as described above. Although bulges 550A and 550B are shown as semicircular, other cross sections, such as triangular or any suitable shape, are contemplated and are included within the scope of the invention. Although the bulges appear to penetrate half-way (50%) above the lead thickness, other penetrations, such as one 25% or 90% or any suitable penetration, are contemplated and included within the scope of the invention. Bulges may be formed by machining, crimping, stamping or any suitable method.

Although each embodiment shows two strain relief sections, one in each lead, only a single strain relief section or more than two strain relief sections are contemplated and are included within the scope of the invention. In the alternative two or more strain relief section may be placed in a single lead while the other lead does not have any strain relief sections. Although in each embodiment the strain relief sections are placed symmetrically, other asymmetric configurations are contemplated and are included within the scope of the invention. Although in each embodiment the strain relief sections are shown as relatively close the packaged LED, other configurations with one or more stain relief section further away from the packaged LED are contemplated and are included within the scope of the invention While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

The invention claimed is:

1. An apparatus comprising:
   an electronic component; and
   a leadframe comprising at least one leadframe member connected to the electronic component, the at least one leadframe member having an upper surface, a lower surface opposite the upper surface, and at least one bulge indented into the lower surface and extending above a plane of the upper surface, the bulge having an upper section in which a thickness between the upper surface and lower surface of the leadframe member is smaller than a thickness between the upper surface and lower surface of the leadframe member outside of the bulge; and
   a subassembly facing the lower surface of the at least one leadframe member and connected to the at least one leadframe member at a clinching position, the bulge positioned between and spaced apart from the electronic component and the clinching position.

2. The apparatus of claim 1 wherein the electronic component is an LED.

3. The apparatus of claim 1 wherein the at least one leadframe member is connected to a bottom surface of the electronic component.

4. The apparatus of claim 1 wherein the at least one leadframe member is connected to at least one side surface of the electronic component.

5. The apparatus of claim 1 further comprising at least two leadframe members, the at least two leadframe members being connected to different side surfaces of the electronic component.

6. The apparatus of claim 1, wherein the at least one leadframe member does not have a bend.

* * * * *